(12) United States Patent
Toda et al.

(10) Patent No.: US 9,063,183 B2
(45) Date of Patent: Jun. 23, 2015

(54) MAGNETIC SHIELD, PROGRAM, AND SELECTION METHOD

(75) Inventors: Shigemitsu Toda, Hachioji (JP); Kimio Nagasaka, Hokuto (JP)

(73) Assignee: Seiko Epson Corporation (JP)

( * ) Notice: Subject to any disclaimer, the term of this patent is extended or adjusted under 35 U.S.C. 154(b) by 139 days.

(21) Appl. No.: 13/438,467

(22) Filed: Apr. 3, 2012

(65) Prior Publication Data
US 2012/0249274 A1 Oct. 4, 2012

(30) Foreign Application Priority Data

Apr. 4, 2011 (JP) ................................ 2011-082917
Feb. 23, 2012 (JP) ................................ 2012-037138

(51) Int. Cl.
*H01F 7/00* (2006.01)
*H05K 9/00* (2006.01)
*G01R 33/00* (2006.01)

(52) U.S. Cl.
CPC .................................. *G01R 33/0076* (2013.01)

(58) Field of Classification Search
USPC .......................................... 335/301; 174/353
See application file for complete search history.

(56) References Cited

U.S. PATENT DOCUMENTS

| | | | | |
|---|---|---|---|---|
| 4,646,046 A | * | 2/1987 | Vavrek et al. .................. | 335/301 |
| 4,931,759 A | * | 6/1990 | Breneman et al. ............. | 335/301 |
| 5,749,178 A | * | 5/1998 | Garmong ........................ | 52/79.1 |
| 6,229,423 B1 | * | 5/2001 | Sasada et al. .................. | 335/301 |
| 6,294,972 B1 | * | 9/2001 | Jesmanowicz et al. ........ | 335/301 |
| 7,795,708 B2 | * | 9/2010 | Katti .............................. | 257/659 |
| 2005/0162249 A1 | * | 7/2005 | Simola .......................... | 335/301 |
| 2007/0278628 A1 | * | 12/2007 | Katti .............................. | 257/659 |

FOREIGN PATENT DOCUMENTS

| | | |
|---|---|---|
| JP | 05-327263 | 12/1993 |
| JP | 2008-282983 | 11/2008 |
| JP | 2008-288328 | 11/2008 |

* cited by examiner

*Primary Examiner* — Alexander Talpalatski
(74) *Attorney, Agent, or Firm* — Harness, Dickey & Pierce, P.L.C.

(57) ABSTRACT

A magnetic shield including a first layer and a second layer and shielding an environmental magnetic field is obtained by manufacturing the first layer that is configured by a first material and that includes a hollow portion on the inside and the second layer that is configured by a second material that is different from the first material and which is a hollow member and placing the second layer in the hollow portion of the first layer. With the magnetic shield, in regions between the first layer and the second layer, a material in which the relative magnetic permeability at the strength of the magnetic field at a region that is next to the second layer is high compared to the relative magnetic permeability of the first material at the strength of the magnetic field is selected as the second material that configures the second layer.

1 Claim, 7 Drawing Sheets

FIG. 5

|  | OUTER LAYER | INNER LAYER | CENTER PORTION MAGNETIC FLUX DENSITY | SHIELD FACTOR | |
|---|---|---|---|---|---|
|  |  |  |  | MAGNITUDE | DECIBEL |
| CASE 1 | MATERIAL α $\mu r = 22182$ | MATERIAL α $\mu r = 107430$ | −1.15E−07T | 89 TIMES | 39 dB |
| CASE 2 |  | MATERIAL β $\mu r = 187007$ | −6.74E−08T | 152 TIMES | 44 dB |

FIG. 6

|  | OUTER LAYER | INNER LAYER | CENTER PORTION MAGNETIC FLUX DENSITY | SHIELD FACTOR | |
|---|---|---|---|---|---|
|  |  |  |  | MAGNITUDE | DECIBEL |
| CASE 1a | MATERIAL α $\mu r = 22182$ | MATERIAL α $\mu r = 107430$ | −3.02E−08T | 1491 TIMES | 63 dB |
| CASE 2a |  | MATERIAL β $\mu r = 187007$ | −1.75E−08T | 2581 TIMES | 68 dB |

FIG. 11

|  | OUTER LAYER | INTERMEDIATE LAYER | INNER LAYER |
|---|---|---|---|
| CASE 3 | MATERIAL α $\mu r = 22182$ | MATERIAL α $\mu r = 107430$ | MATERIAL α $\mu r = 796$ |
| CASE 4 | | MATERIAL β $\mu r = 187007$ | MATERIAL α $\mu r = 796$ |
| CASE 5 | | | MATERIAL β $\mu r = 80$ |
| CASE 6 | | | MATERIAL γ $\mu r = 7958$ |

FIG. 12

|  | CENTER PORTION MAGNETIC FLUX DENSITY | SHIELD FACTOR | |
|---|---|---|---|
|  |  | MAGNITUDE | DECIBEL |
| CASE 3 | −1.20E−08T | 3752 TIMES | 71 dB |
| CASE 4 | −7.17E−09T | 6293 TIMES | 76 dB |
| CASE 5 | −1.51E−08T | 2995 TIMES | 70 dB |
| CASE 6 | −1.26E−09T | 35731 TIMES | 91 dB |

MAGNETIC SHIELD, PROGRAM, AND SELECTION METHOD

BACKGROUND

1. Technical Field

The present invention relates to a magnetic shield, a program that is used in the selection of the material of the magnetic shield, and a selection method of the material of the magnetic shield.

2. Related Art

In a case when a weak magnetic field is measured as with a magnetoencephalogram or a magneto-cardiograph, it is necessary to isolate only the magnetic field of the measurement target by cancelling, with respect to the measurement target, the far greater magnetic fields, such as geomagnetism, of the external environment. Therefore, in the related art, the environmental magnetic field is cancelled by using a magnetic shield.

As a technology of a magnetic shield that cancels the external environmental magnetic field, a magnetic shield room with a multi-layered structure which is configured so that magnetic permeability becomes gradually lower toward the inner layers using magnetic screening materials with the highest magnetic permeability for the outer layers is described in JP-A-5-327263. Further, a magnetic shield device that combines active and passive magnetic shields is described in JP-A-2008-282983. Further, a magnetic shield device in which a highly conductive material layer on the outside and a magnetic material layer on the inside are formed to be opposed is described in JP-A-2008-288328.

SUMMARY

An advantage of some aspects of the invention is that a magnetic shield is provided that shields a magnetic field with greater efficiency compared to a magnetic shield that is configured by a common material or to a magnetic shield that uses a different material but that is manufactured without attention to the relative magnetic permeability.

According to an aspect of the invention, there is provided a magnetic shield including: a first layer that is configured by a first material and that includes a hollow portion on the inside; and a second layer that is a hollow member that is configured by a second material that is different from the first material, and which is placed in the hollow portion, wherein in regions between the first layer and the second layer, the relative magnetic permeability of the second material at the strength of a magnetic field at a region that is next to the second layer is high compared to the relative magnetic permeability of the first material at the strength of the magnetic field. According to such a configuration, it is possible to provide a magnetic shield that shields a magnetic field with greater efficiency compared to a magnetic shield that is configured by a common material or to a magnetic shield that uses a different material but that is manufactured without attention to the relative magnetic permeability.

According to another aspect of the invention, there is provided a magnetic shield including: three or more layers, wherein out of the three or more layers, in a case when any one layer excluding the layer placed to the innermost side is a first layer and any one layer that is placed in a hollow portion on the inside of the first layer is a second layer, a first material that configures the first layer and a second material that configures the second layer are different, and in regions between the first layer and the second layer, the relative magnetic permeability of the second material at the strength of a magnetic field at a region that is next to the second layer is high compared to the relative magnetic permeability of the first material at the strength of the magnetic field. According to such a configuration, it is possible to provide a magnetic shield that shields a magnetic field with greater efficiency compared to a magnetic shield with two or fewer layers.

It is preferable that the second layer be a layer that is placed on the outermost side out of the layers that are placed in the hollow portion. According to such a configuration, it is possible to provide a magnetic shield that shields a magnetic field with greater efficiency compared to a magnetic shield in a case when a layer other than the outermost layer out of the layers that are placed in the hollow portion on the inside of the first layer is the second layer in a magnetic shield that includes three or more layers.

According to still another aspect of the invention, there is provided a program for causing a computer that includes a storage section that stores the relative magnetic permeability with respect to the strength of a magnetic field for each material to function, the program including: a specifying section that specifies the strength of a magnetic field of the environment in which a magnetic shield is placed; a first selection section that references the storage content of the storage section and selects the material with the greatest relative magnetic permeability with respect to the strength of the magnetic field that is specified in the specifying section as a first material that is the material of the outer layer of the magnetic shield; an estimating section that estimates, in a case when the outer layer is manufactured using the first material that is selected by the first selection section, in regions between the outer layer and an inner layer that is placed in a hollow portion on an inside of the outer layer, the strength of the magnetic field in a region that is next to the inner layer; and a second selection section that references the storage content of the storage section and selects the material with the greatest relative magnetic permeability with respect to the strength of the magnetic field that is estimated by the estimating section as a second material that is the material of the inner layer. According to such a configuration, compared to a magnetic shield that is configured by a common material or to a magnetic shield that uses a different material but that is manufactured without attention to the relative magnetic permeability, the selection of materials that are necessary for manufacturing a magnetic shield that shields a magnetic field with high efficiency can be performed by a computer.

According to still another aspect of the invention, there is provided a selection method of the material of a magnetic shield including: a specifying section specifying the strength of a magnetic field of the environment in which a magnetic shield is placed, a first selection section referencing the storage content of a storage section in which the relative magnetic permeability with respect to the strength of a magnetic field for each material is stored and selecting the material with the greatest relative magnetic permeability with respect to the strength of the magnetic field that is specified by the specifying section as the first material that is the material of the outer layer of the magnetic shield, an estimating section estimating, in a case when the outer layer is manufactured using the first material that is selected by the first selection section, in regions between the outer layer and an inner layer that are placed in a hollow portion on an inside of the outer layer, the strength of the magnetic field in a region that is next to the inner layer, and a second selection section referencing the storage content of the storage section and selecting the material with the greatest relative magnetic permeability with respect to the strength of the magnetic field that is estimated by the estimating section as a second material that is the material of the inner layer. According to such a configuration, compared to a magnetic shield that is configured by a common material or to a magnetic shield that uses a different material but that is manufactured without attention to the relative magnetic permeability, the selection of materials that are necessary for manufacturing a magnetic shield that shields a magnetic field with high efficiency can be made.

BRIEF DESCRIPTION OF THE DRAWINGS

The invention will be described with reference to the accompanying drawings, wherein like numbers reference like elements.

FIG. 5 is a diagram in which the shield factors according to Example 1-1 are compared.

FIG. 6 is a diagram in which the shield factors according to Example 1-2 are compared.

FIG. 11 is a diagram that represents the relative magnetic permeability of each layer in Example 2.

FIG. 12 is a diagram in which the shield factors according to Example 2 are compared.

DESCRIPTION OF EXEMPLARY EMBODIMENTS

1. First Embodiment

Figure 1:
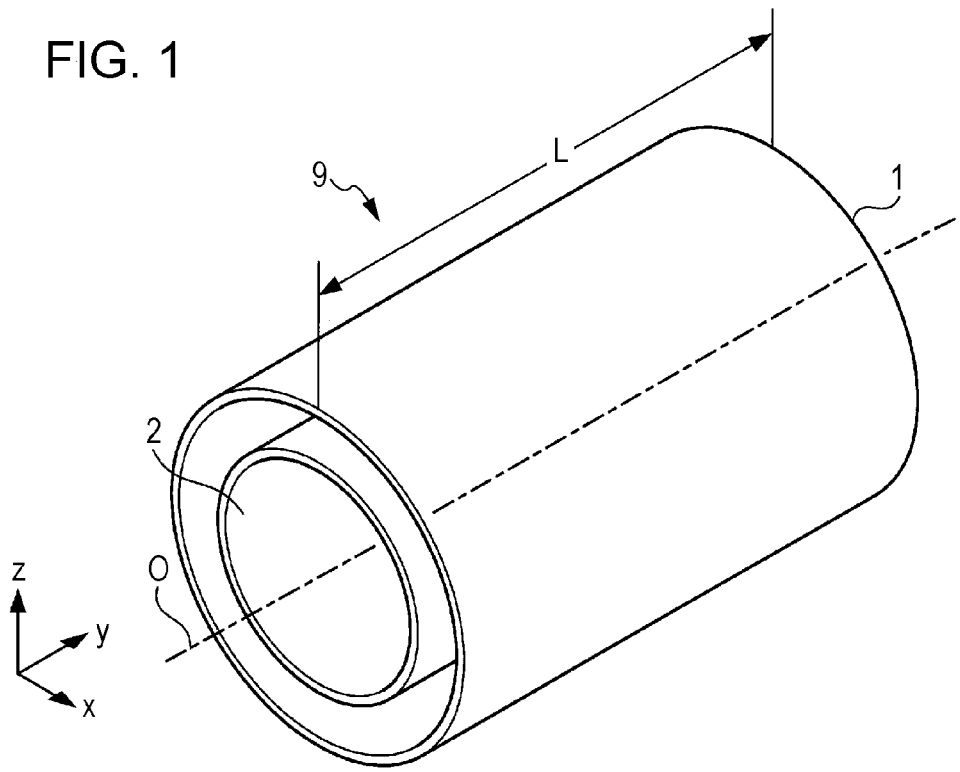
FIG. 1 is a diagram that illustrates an outline of a magnetic shield according to a first aspect of the invention.
Figure 2:
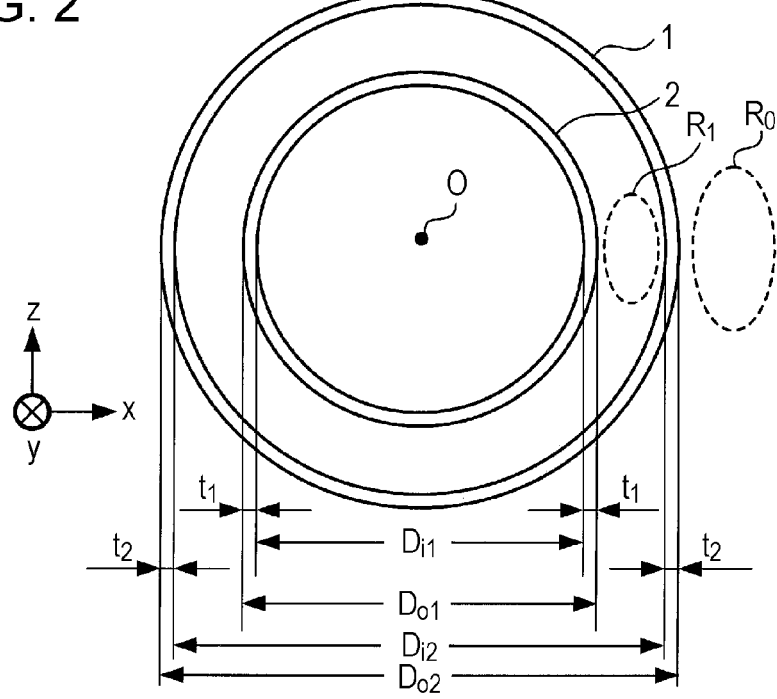
FIG. 2 is a diagram when the magnetic shield is viewed in the axial direction.

FIG. 1 is a diagram that illustrates an outline of a magnetic shield 9 according to a first embodiment of the invention. The space in which the magnetic shield 9 is placed is represented as an xyz right-handed coordinate space in order to describe the placement and the like of each configuration of the magnetic shield 9. Here, out of the coordinate symbols, the symbol in which two segments that intersect within a circle of which the inside is white represents the arrow from the front side of the paper to the back side. The direction in which the x components increase in the space is referred to as the +x direction, and the direction in which the x components decrease is referred to as the −x direction. Similarly, with the y and z components, the +y direction, the −y direction, the +z direction, and the −z direction are defined. FIG. 2 is a diagram when the magnetic shield 9 is viewed in the +y direction.

As illustrated in FIGS. 1 and 2, the magnetic shield 9 is a magnetic shield with a two-layered structure which includes an outer layer 1 that includes a hollow portion on the inside and an inner layer 2 that is a hollow member which is placed in the hollow portion of the outer layer 1. The outer layer 1 and the inner layer 2 are both cylindrical members with a length L in the axial direction (+y direction) that is determined in advance. An outer diameter $D_{o1}$ of the inner layer 2 is smaller than an inner diameter $D_{i2}$ of the outer layer 1. The inner layer 2 is placed so that the axis thereof overlaps an axis O of the outer layer 1. Here, the diameter direction is a direction that extends into the surroundings on a vertical plane in the axial direction with a point in which the plane and the axis O intersect as the center. The diameter direction therefore includes the ±x direction and the ±z direction.

Out of various magnetic body materials such as a permalloy, various iron-based amorphous materials, chromium, or cobalt, and a ferrite sintered body, a material with a relatively high relative magnetic permeability with respect to the strength of the magnetic field of the environment in which the magnetic shield 9 is placed is selected as the material of the outer layer 1. Here, the material of the outer layer 1 is a material α. Out of the various magnetic body materials described above, a material β that is a different material from the material α and that has a relatively higher relative magnetic permeability with respect to the strength of the magnetic field that is observed between the outer layer 1 and the inner layer 2 than the relative magnetic permeability of the material α with respect to the strength of the magnetic field is selected as the material of the inner layer 2. That is, the outer layer 1 is configured by a first material, and is an example of a first layer that includes a hollow portion on the inside, and the inner layer 2 is a hollow member which is configured by a second material that is different from the first material, and is an example of a second layer that is placed in the hollow portion of the first layer. Furthermore, the material α is an example of the first layer that configures the first layer. The material β is a material that configures the second layer, and is an example of the second material in which the relative magnetic permeability at the strength of a magnetic field between the first layer and the second layer in the hollow portion of the first layer is high compared to the relative magnetic permeability of the first material at the strength of the magnetic field.

α and β will be described in more detail. Equation 1 below is an equation for finding the diameter direction execution shield factor of the magnetic shield 9 of the two layers of cylindrical openings.

$$S_{T1} = \left(\frac{\mu_{r1} t_1}{D_{o1}}\right) \quad (1)$$

$$S_{T2} = \left(\frac{\mu_{r2} t_2}{D_{o2}}\right)$$

$$S_{Top} \approx 1.5 exp\left[k_T\left(\frac{L}{D_{i1}}\right)\right]$$

$$S_{TD} = S_{T1} S_{T2}\left(1 - \frac{D_{o1}^2}{D_{i2}^2}\right) + S_{T1} + S_{T2} + 1$$

$$S_{Teff} = \frac{1}{\frac{1}{S_{TD}} + \frac{1}{S_{Top}}}$$

The meaning of each symbol in Equation 1 above is as follows.

μ: magnetic permeability of magnetic body material [H/m], $\mu_0$: vacuum magnetic permeability=$4\pi \times 10^{-7}$ [H/m], $\mu_r = \mu/\mu_0$:

relative magnetic permeability of magnetic body material, $\mu_{r1}$: relative magnetic permeability of inner layer 2, $\mu_{r2}$: relative magnetic permeability of outer layer 1, $t_1$: thickness of magnetic body material of inner layer 2 [m], $t_2$: thickness of magnetic body material of outer layer 1 [m], $D_{o1}$: outer diameter of inner layer 2 [m], $D_{o2}$: outer diameter of outer layer 1 [m], $D_{i1}$: inner diameter of inner layer 2 [m], $D_{i2}$: inner diameter of outer layer 1 [m], L: length of magnetic shield 9 [m], $S_{T1}$: shield factor of diameter direction, infinite length, and inner layer 2 alone, $S_{T2}$: shield factor of diameter direction, infinite length, and outer layer 1 alone, $S_{Top}$: shield factor of diameter direction, finite length, and inner layer 2 alone, $S_{TD}$: shield factor of diameter direction, infinite length, and magnetic shield 9, $S_{Teff}$: execution shield factor of diameter direction, finite length, opening, and magnetic shield 9.

The shield factor of a magnetic shield is an index that represents the performance of the magnetic shield, and the higher the shield factor of the magnetic shield, the higher the performance of the magnetic shield. As can be seen from Equation 1 above, the higher the relative magnetic permeability $\mu_r$, the higher the shield factor of the magnetic shield. On the other hand, the relative magnetic permeability $\mu_r$ of the magnetic body material is dependent on the strength of a magnetic field H at the location in which the magnetic body material is placed.

Figure 3:
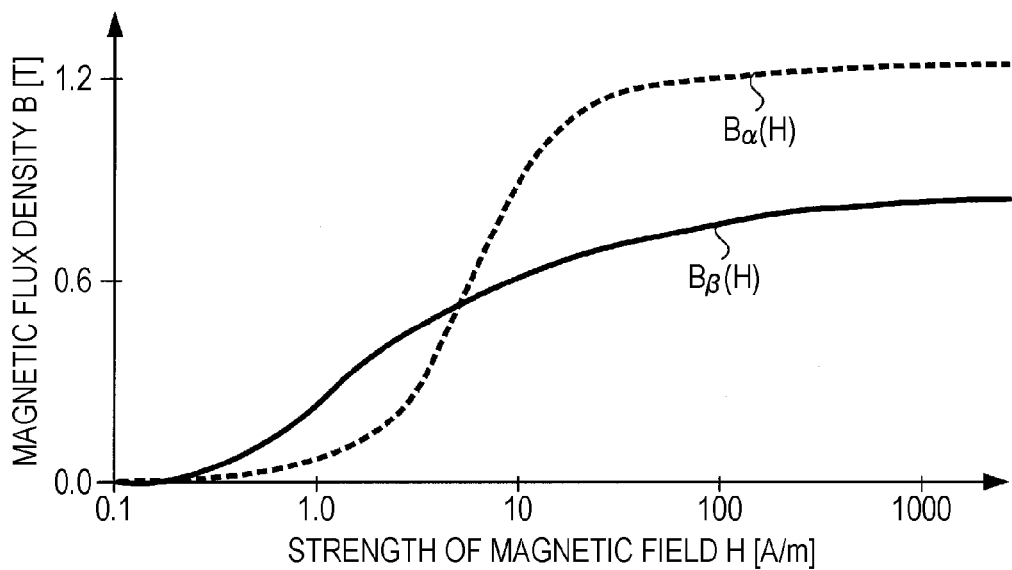
FIG. 3 is a diagram that represents changes in the magnetic flux density of a magnetic body material with respect to the strength of a magnetic field.

FIG. 3 is a diagram that represents changes in the magnetic flux density of a magnetic body material with respect to the strength of a magnetic field. A magnetic flux density B [T] of the material α changes according to the curve of Bα (H) that is indicated in FIG. 3 by a broken line with respect to the strength of the magnetic field H [A/m] of the environment in which the material α is placed. The magnetic flux density B [T] of the material β changes according to the curve of Bβ (H) that is indicated in FIG. 3 by a solid line with respect to the strength of the magnetic field H [A/m] of the environment in which the material β is placed.

The magnetic flux density B [T] of the magnetic body material is represented by the product of the magnetic permeability μ of the magnetic body material and the strength of the magnetic field H of the environment in which the magnetic body material is placed. The relative magnetic permeability $\mu_r$ of the magnetic body material is defined by an equation in which the magnetic permeability μ is divided by the vacuum magnetic permeability $\mu_0$, that is, $\mu_r = \mu/\mu_0$. Therefore, the relationship of B-H is represented by Equation 2 below.

$$B = B_\alpha(H) = \mu_{r\alpha}(H) \cdot \mu_0 \cdot H$$

$$B = B_\beta(H) = \mu_{r\beta}(H) \cdot \mu_0 \cdot H \quad (2)$$

Figure 4:
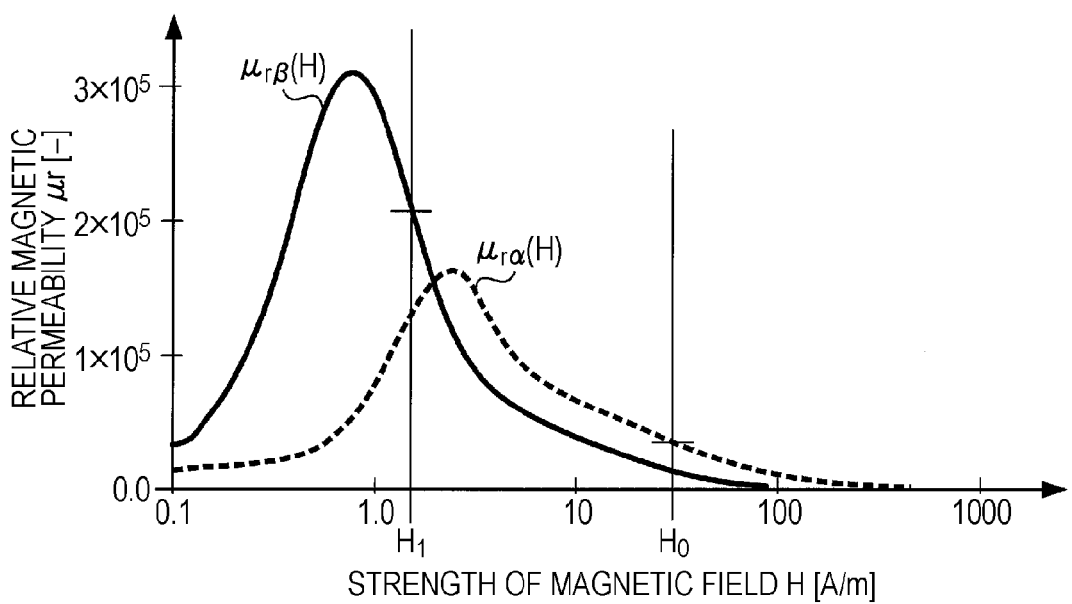
FIG. 4 is a diagram that represents changes in the relative magnetic permeability of the magnetic body material with respect to the strength of a magnetic field.

Based on Equation 2, the curve of FIG. 3 is converted to a curve that represents the relationship of the relative magnetic permeability of each material with respect to the strength of a magnetic field. FIG. 4 is a diagram that represents changes in the relative magnetic permeability of the magnetic body material with respect to the strength of a magnetic field. As illustrated in FIG. 4, by respectively dividing the magnetic flux density B [T] of each material by the product of the vacuum magnetic permeability $\mu_0$ and the strength of the magnetic field H, change curves of the relative magnetic permeabilities $\mu_r\alpha$ (H) and $\mu_r\beta$ (H) of each material with respect to the strength of the magnetic field H [A/m] are obtained. The relative magnetic permeabilities $\mu_r\alpha$ (H) and $\mu_r\beta$ (H) of each material are both represented by functions that depend on the strength of the magnetic field H [A/m], and have individual peaks for each material. The magnetic shield 9 is designed based on the change curve illustrated in FIG. 4.

An example of the designing method of the magnetic shield 9 is shown below. If the environment in which the magnetic shield 9 is placed is Tokyo, for example, it is known that the geomagnetic level in Tokyo is approximately 45 [μT]. If such a value is converted into the strength of the environmental magnetic field $H_0$ [A/m], the case is as below.

$$H_0 = 45 \, [\mu T]/(4\pi \times 10^{-7}) \approx 35.8 \, [A/m]$$

That is, in a case when the magnetic shield 9 is placed in Tokyo, a magnetic shield with a strength of 35.8 [A/m] is input to the outer layer 1. The strength of the environmental magnetic shield $H_0$ [A/m] is, for example, the strength of the magnetic field of the region $R_0$ illustrated in FIG. 2.

As illustrated in FIG. 4, if the relative magnetic permeability $\mu_r\alpha$ ($H_0$) of the material α and the relative magnetic permeability $\mu_r\beta$ ($H_0$) of the material β with respect to the strength of the environmental magnetic field $H_0$ are compared, it can be seen that the relative magnetic permeability $\mu_r\alpha$ ($H_0$) of the material α is higher than the relative magnetic permeability $\mu_r\beta$ ($H_0$) of the material β. Therefore, the material α is selected as the material of the outer layer 1.

Next, a magnetic field $H_1$ of a region $R_1$ on the inside in a case when a cylindrical opening magnetic shield is configured by only the outer layer 1 using the material α is specified. The region $R_1$ is the region of a hollow portion on the inside of the outer layer 1 using the material α in FIG. 2, and is a region between the outer layer 1 and the inner layer 2. Further, the magnetic field $H_1$ is the magnetic field of the region $R_1$ in a case when a cylindrical opening magnetic shield is configured by only the outer layer 1 using the material α. The strength of the magnetic field $H_1$ [A/m] of the region $R_1$ in a case when a cylindrical opening magnetic shield is configured only by the outer layer 1 using the material α is ascertained by measurements or simulations.

1-1. Example 1-1

Example 1-1 that is a first example according to the first embodiment will be described.

Here, the strength of the magnetic field $H_1$ [A/m] will be ascertained by performing a simulation with the conditions below.

$\mu_r = \mu_r\alpha$ ($H_0$) of the outer layer 1 using the material α=22182
$\mu_r = \mu_r\alpha$ ($H_1$) in a case when the material α is used as the inner layer 2 in Case 1=107430
$\mu_r = \mu_r\beta$ ($H_1$) in a case when the material β is used as the inner layer 2 in Case 2=187007
Inner diameter [m] of the inner layer 2: $D_{i1}$=0.2
Inner diameter [m] of the outer layer 1: $D_{i2}$=0.3
Thickness [m] of the magnetic body material of the inner layer 2: $t_1$:=0.001
Thickness [m] of the magnetic body material of the outer layer 1: $t_2$:=0.001
Environmental magnetic field [μT]: $B_0$=10
Length [m] of the magnetic shield 9: L=0.8

As a result of such a simulation, since the magnetic flux density $B_1$ of the region $R_1$ in a case when the cylindrical opening magnetic shield is configured only by the outer layer 1 using the material α is specified to be 2.3 [μT], the strength of the magnetic field $H_1$ [A/m] of the region $R_1$ in a case when the cylindrical opening magnetic shield is configured by only the outer layer 1 using the material α is ascertained by the following calculation.

$$H_1 = 2.3 \, [\mu T]/(4\pi \times 10^{-7}) \approx 1.83 \, [A/m]$$

That is, in the case of a magnetic shield 9 that is placed in Tokyo and in which the outer layer 1 is configured by the material α, the environmental magnetic field decreases to 1.83 [A/m] due to magnetic field attenuation by the outer layer 1 in the region R1. Therefore, a magnetic field level of 1.83 [A/m] that is attenuated in the outer layer 1 is input to the inner layer 2.

As illustrated in FIG. 4, if the relative magnetic permeability $\mu_r\alpha$ ($H_1$) of the material $\alpha$ and the relative magnetic permeability $\mu_r\beta$ ($H_1$) of the material $\beta$ with respect to the strength of the environmental magnetic field $H_1$ are compared, it can be seen that the relative magnetic permeability $\mu_r\alpha$ ($H_1$) of the material $\alpha$ is higher than the relative magnetic permeability $\mu_r\beta$ ($H_1$) of the material $\beta$. Therefore, the material $\alpha$ is selected as the material of the inner layer 2.

By each material of the outer layer 1 and the inner layer 2 being selected in such a manner, the shield factor of the magnetic shield 9 increases, and the shielding effect of a magnetic field by the magnetic shield 9 is improved. FIG. 5 is a diagram in which the shield factors of a two-layered shield that is manufactured by the same material and the magnetic shield 9 described above are compared. Case 1 illustrated in FIG. 5 is a two-layered shield in which the outer layer 1 and the inner layer 2 are manufactured by the same material $\alpha$ of the related art. On the other hand, Case 2 is the magnetic shield 9 described above, and the outer layer 1 and the inner layer 2 are respectively manufactured by the material $\alpha$ and the material $\beta$. As a result, while the magnetic flux density of the central portion of Case 1 is $-1.15 \times 10^{-7}$ [T], the magnetic flux density of the central portion of Case 2 is $-6.74 \times 10^{-8}$ [T]. Here, the "magnetic flux density of the central portion" is the magnetic flux density at the position of the two-layered shield of Case 1 or the axis of the magnetic shield 9 of Case 2. This signifies that while the magnitude of the shielding of the magnetic field by the two-layered shield of Case 1 is 89 times, the magnitude of the shielding of the magnetic field by the magnetic shield 9 of Case 2 is 152 times, which is an increase by approximately 1.7 times. In other words, the effect of shielding the magnetic field by the magnetic shield 9 is a performance improvement of approximately 5 dB over the two-layered shield of the related art.

1-2. Example 1-2

Example 1-2 that is a second example according to the first embodiment will be described.

Here, the strength of the magnetic field $H_1$ [A/m] will be ascertained by performing a simulation with the conditions below. Here, while similarly to Example 1-1, the simulation was performed using an algorithm based on a finite element method, the conditions relating to the discretization of the space in Example 1-2 was different from Example 1-1 described above.

$\mu_r=\mu_r\alpha$ ($H_0$) of the outer layer 1 using the material $\alpha$=22182
Inner diameter [m] of the inner layer 2:$D_{i1}$=0.2
Inner diameter [m] of the outer layer 1:$D_{i2}$=0.3
Thickness [m] of the magnetic body material of the inner layer 2:$t_2$:=0.000278
Thickness [m] of the magnetic body material of the outer layer 1:$t_2$=0.000278
Environmental magnetic field [$\mu$T]:$B_0$=45
Length [m] of the magnetic shield 9:L=0.8

As a result of such a simulation, since the magnetic flux density $B_1$ of the region $R_1$ in a case when the cylindrical opening magnetic shield is configured only by the outer layer 1 using the material $\alpha$ is specified to be 2.3 [$\mu$T], the strength of the magnetic field $H_1$ [A/m] of the region $R_1$ in a case when the cylindrical opening magnetic shield is configured by only the outer layer 1 using the material $\alpha$ is ascertained by the following calculation.

$$H_1 = 2.3\ [\mu T]/(4\pi \times 10^{-7}) \approx 1.83\ [A/m]$$

That is, in the case of a magnetic shield 9 that is placed in Tokyo and in which the outer layer 1 is configured by the material $\alpha$, the environmental magnetic field decreases to 1.83 [A/m] due to magnetic field attenuation by the outer layer 1 in the region R1. Therefore, a magnetic field level of 1.83 [A/m] that is attenuated in the outer layer 1 is input to the inner layer 2.

Here, if a case when the inner layer 2 using the material $\alpha$ is provided on the inside of the outer layer 1 using the material $\alpha$ is Case 1$a$ and a case when the inner layer 2 using the $\beta$ material is Case 2$a$, the respective relative magnetic permeabilities are as below.

$\mu_r=\mu_r\alpha$ ($H_1$) in Case 1$a$=107430
$\mu_r=\mu_r\beta$ ($H_1$) in Case 2$a$=187007

That is, it can be seen that the relative magnetic permeability $\mu_r\beta$ ($H_1$) of the material $\beta$ is higher than the relative magnetic permeability $\mu_r\alpha$ ($H_1$) of the material $\alpha$. The material $\beta$ is therefore selected as the material of the inner layer 2.

By selecting each material of the outer layer 1 and the inner layer 2 in such a manner, the shield factor of the magnetic shield 9 increases, and the shielding effect of the magnetic field by the magnetic shield 9 is improved. FIG. 6 is a diagram in which the shield factors of a two-layered shield that is manufactured by the same material and of the magnetic shield 9 described above are compared. Case 1$a$ illustrated in FIG. 6 is a two-layered shield in which the outer layer 1 and the inner layer 2 are manufactured by the same material $\alpha$ as in the related art. On the other hand, Case 2$a$ is the magnetic shield 9 described above, and the outer layer 1 and the inner layer 2 are respectively manufactured by the material $\alpha$ and the material $\beta$. As a result, while the magnetic flux density at the center portion of Case 1$a$ is $-3.02 \times 10^{-8}$ [T], the magnetic flux density at the center portion of Case 2$a$ is $-1.75 \times 10^{-8}$ [T]. This signifies that while the magnitude of the shielding of the magnetic field by the two-layered shield of Case 1$a$ is 1491 times, the magnitude of the shielding of the magnetic field by the magnetic shield 9 of Case 2$a$ is 2581 times, which is an increase by approximately 1.7 times. In other words, the effect of shielding the magnetic field by the magnetic shield 9 is a performance improvement of approximately 5 dB over the two-layered shield of the related art.

With the magnetic shield 9 that is manufactured by each material being selected, even if a magnetic shield that is configured by a common material or different materials are used, for example, shielding of the magnetic field is performed with higher efficiency compared to a magnetic shield that is manufactured without attention to the relative magnetic permeabilities thereof.

Here, the invention can also be contemplated as a manufacturing method of the magnetic shield 9 described above and a selection method of the material of the magnetic shield 9. Further, the invention can also be contemplated as a selection device that selects the material for manufacturing the magnetic shield 9 described above, and furthermore, can also be contemplated as a computer program (hereinafter, simply referred to as a program) that causes a computer that is such a selection device to select the material for manufacturing the magnetic shield 9 described above.

Figure 7:
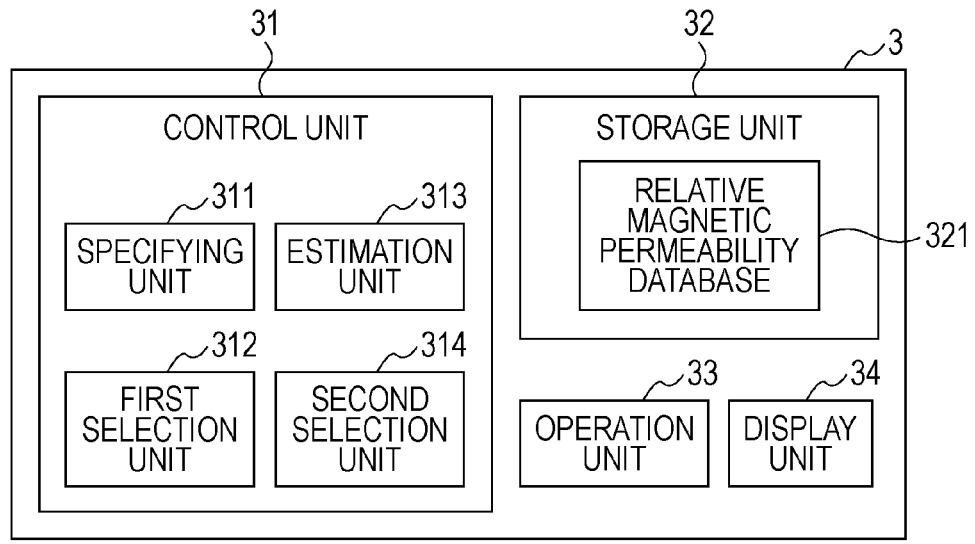
FIG. 7 is a diagram that illustrates an example of a selection device that selects the material for manufacturing the magnetic shield.

FIG. 7 is a diagram that illustrates an example of a selection device 3 that selects the material for manufacturing the magnetic shield 9. The selection device 3 includes a control unit 31, a storage unit 32, an operation unit 33, and a display unit 34. The control unit 31 includes a CPU (Central Processing Unit), a ROM (Read Only Memory), a RAM (Random Access Memory), and the like, and each portion of the selection device 3 is controlled by the CPU reading and executing a bootloader that is stored in the ROM or a program that is stored in the storage unit 32 by the RAM. The storage unit 32 is a mass capacity storage means such as a hard disk drive, and stores the program that is used by the control unit 31. The operation unit 33 includes operating buttons, a touch panel, and the like for inputting various instructions, receives operations by the user, and supplies signals according to the content of such operations to the control unit 31. The display unit 34 displays an interactive window on which controls are performed, a window that represents the results of the selection, or the like under the control of the control unit 31. The display unit 34 is configured, for example, by a display element using liquid crystals or the like.

Further, the storage unit 32 includes a relative magnetic permeability database 321 that stores data in which changes to the relative magnetic permeability with respect to the strength of a magnetic field are represented for each material. Other than the materials α and β illustrated in FIG. 4, the relative magnetic permeability database 321 stores changes to the relative magnetic permeability with respect to the strength of a magnetic field for a plurality of materials. Here, in a case when the relative magnetic permeability is represented as a function of the strength of a magnetic field, the relative magnetic permeability database 321 may store the parameters that used for such a function.

The control unit 31 functions respectively as a specifying unit 311, a first selection unit 312, an estimation unit 313, and a second selection unit 314. The action of each such configuration of the control unit 31 will be described below.

Figure 8:
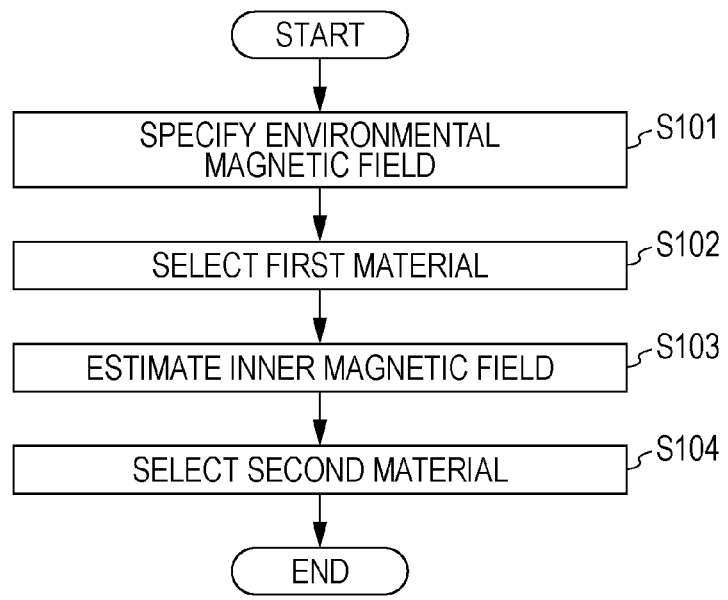
FIG. 8 is a flowchart for describing the actions of material selection by a control unit.

FIG. 8 is a flowchart for describing the actions of material selection by the control unit 31. The specifying unit 311 specifies the strength of the magnetic field $H_0$ [A/m] of the environment in which the magnetic shield 9 is placed based on a signal that corresponds to an operation that is output from the operation unit 33 which receives the operation of the user which is output to the control unit 31, for example (step S101). The first selection unit 312 references the relative magnetic permeability database 321 of the storage unit 32 and selects the material that exhibits the highest relative magnetic permeability with respect to the strength of a magnetic field $H_0$ [A/m] as the first material that is the material of the outer layer 1 based on the strength of the magnetic field $H_0$ [A/m] that is specified by the specifying unit 311 (step S102).

Next, in a case when the outer layer 1 is manufactured using the first material that is selected in step S102, the estimation unit 313 estimates the strength of the magnetic field $H_1$ [A/m] of a region of the hollow portion on the inside of the outer layer 1 which is a region between the outer layer 1 and the inner layer 2 (step S103). The second selection unit 314 references the relative magnetic permeability database 321 of the storage unit 32 and selects the material that exhibits the greatest strength of magnetic field $H_1$ [A/m] that is estimated by the estimation unit 313 as the second material that is the material of the inner layer 2 (step S104).

By causing the control unit 31 of the selection device 3 to be operated according to the program as described above, each material that respectively configures the outer layer 1 and the inner layer 2 of the magnetic shield 9 is selected.

2. Second Embodiment

Figure 9:
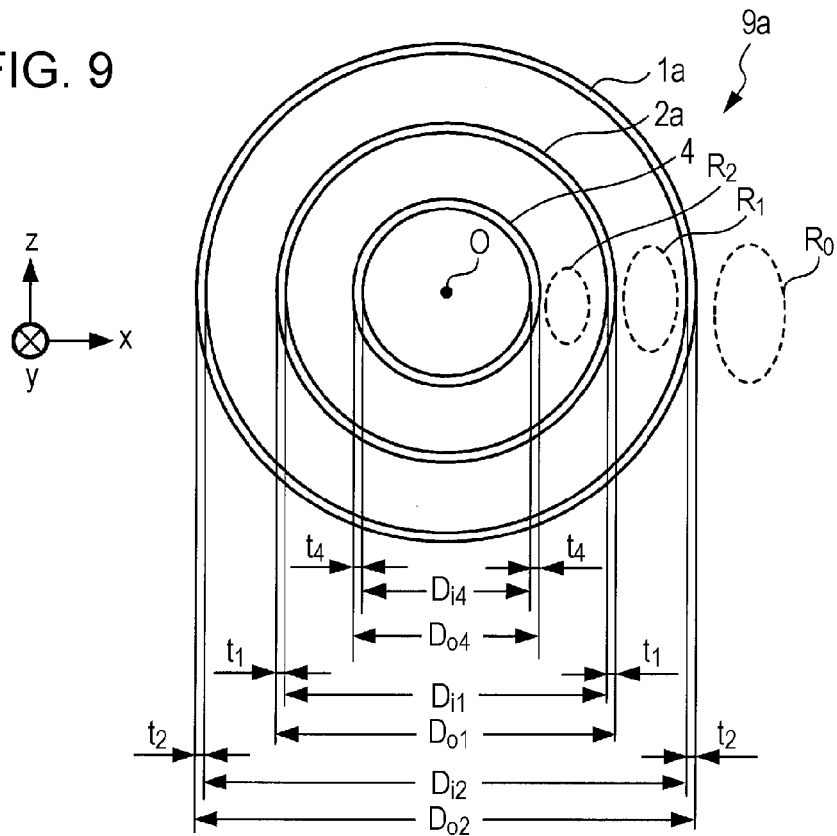
FIG. 9 is a diagram of when a magnetic shield according to a second aspect of the invention is viewed in the axial direction.

While the magnetic shield 9 has a two-layered structure of including the outer layer 1 and the inner layer 2 according to the first embodiment, the number of layers that the magnetic shield includes is not limited to two, and may be three or more. FIG. 9 is a diagram when a magnetic shield 9a according to a second embodiment of the invention is viewed in the +y direction.

As illustrated in FIG. 9, the magnetic shield 9a is a magnetic shield with a three-layered structure which includes an outer layer 1a that includes a hollow portion on the inside, an intermediate layer 2a that is a hollow member that is placed in the hollow portion of the outer layer 1a, and an inner layer 4 that is a hollow member that is placed in the hollow portion of the intermediate layer 2a. The outer layer 1a, the intermediate layer 2a, and the inner layer 4 all have a length L in the axial direction (+y direction) which is determined in advance. The shape and size of the outer layer 1a are the same as the outer layer 1 of the magnetic shield 9 of the first embodiment, and the shape and size of the intermediate layer 2a are the same as the inner layer 2 of the magnetic shield 9 of the first embodiment. The magnetic shield 9a differs from the magnetic shield 9 in that the inner layer 4 is placed in the region of the hollow portion on the inside of the intermediate layer 2a. The inner layer 4 is a cylindrical member in which the outer diameter and the inner diameter are respectively an outer diameter $D_{o4}$, an inner diameter $D_{i4}$, and a thickness $t_4$. The outer diameter $D_{o4}$ of the inner layer 4 is smaller than an inner diameter $D_{i1}$ of the intermediate layer 2a. The inner layer 4 is placed so that the axis thereof overlaps an axis O of the outer layer 1.

As illustrated in FIG. 9, a region $R_0$ is a region that is next to the outer layer 1a out of the regions on the outside of the outer layer 1a. Here, a "region that is next to" a given layer refers to a region in which another layer is not interposed between the layer and the given layer. That is, a "region that is next to the outer layer 1a" refers to a region in which no layers other than the outer layer 1a are interposed between the layer and the outer layer 1a.

Further, as illustrated in FIG. 9, the region $R_1$ is a region that is next to the intermediate layer 2a in regions between the outer layer 1a and the intermediate layer 2a. Furthermore, a region $R_2$ is a region that is next to the inner layer 4 in regions between the outer layer 1a and the inner layer 4. Needless to say, it can also be said that the region $R_2$ is a region that is next to the inner layer 4 in regions between the intermediate layer 2a and the inner layer 4.

Here, a material with a high relative magnetic permeability with respect to the strength of the magnetic field that is measure between the outer layer 1 and the inner layer 2 compared to the relative magnetic permeability of the material of the outer layer 1 with respect to the strength of the magnetic field is selected as the material of the inner layer 2 according to the first embodiment described above. Furthermore, the magnetic shield 9 according to the first embodiment has a two-layered structure. That is, there are no other layers interposed between the outer layer 1 and the inner layer 2 of the magnetic shield 9. Therefore, "between the outer layer 1 and the inner layer 2" refers to "a region that is next to the inner layer 2 in regions between the outer layer 1 and the inner layer 2".

With the magnetic shield 9a, in addition to the materials α and β that are used in the magnetic shield 9, a material γ that is different therefrom is used.

Figure 10:
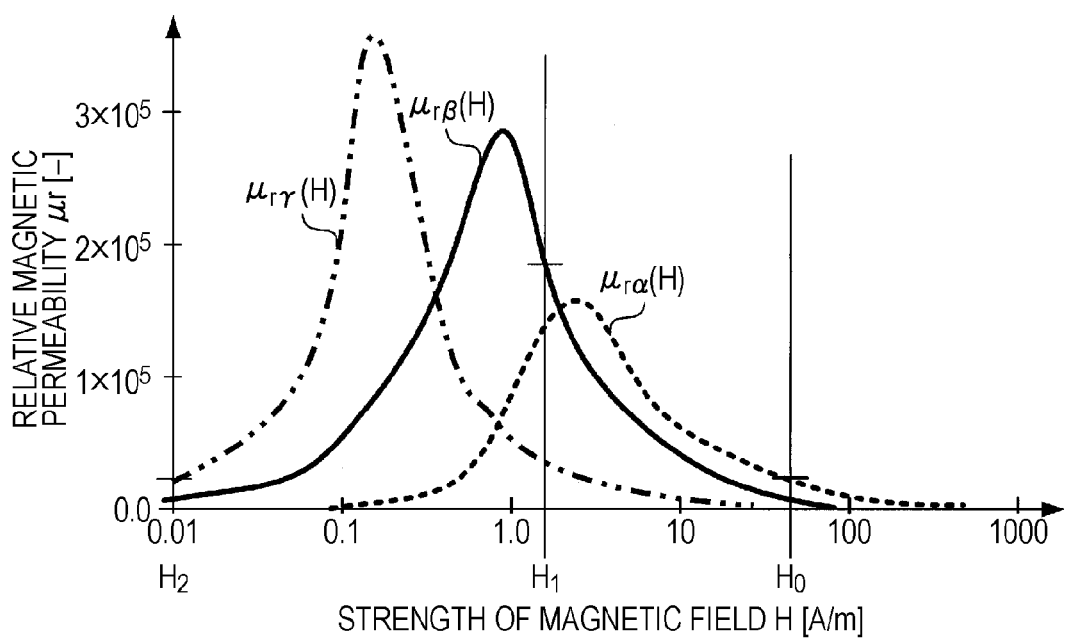
FIG. 10 is a diagram that represents changes in the relative magnetic permeability of the magnetic body material with respect to the strength of a magnetic field.

FIG. 10 is a diagram that represents changes in the relative magnetic permeability of the magnetic body material with respect to the strength of a magnetic field. Change curves of the relative magnetic permeability of each material $\mu_r\alpha$ (H), $\mu_r\beta$ (H), and $\mu_r\gamma$ (H) with respect to the strength of a magnetic field H [A/m] are illustrated in FIG. 10. The relative magnetic permeabilities of each of the materials $\mu_r\alpha$ (H), $\mu_r\beta$ (H), and $\mu_r\gamma$ (H) are all represented by functions that are dependent on the strength of the magnetic field H [A/m], and have individual peaks for each material. The magnetic shield 9a is designed based on such change curves that are illustrated in FIG. 10.

An example of the designing method of the magnetic shield 9a is shown below. If, similarly to the first embodiment, the environment in which the magnetic shield 9a is placed is Tokyo, the geomagnetic level thereof is approximately 45 [μT]. The strength of the environmental magnetic field $H_0$ [A/m] is approximately 35.8 [A/m]. The strength of the environmental magnetic field $H_0$ [A/m] is, for example, the strength of the environmental magnetic field of the region $R_0$ illustrated in FIG. 9.

2-1. Example 2

Example 2 that is an example according to the second embodiment will be described.

Cases 3, 4, 5, and 6 are considered in Example 2. Case 3 is a case when the material α is used for all of the outer layer 1a, the intermediate layer 2a, and the inner layer 4. Case 4 is a case when the material α is used for the outer layer 1a, the material β is used for the intermediate layer 2a, and the material α is used for the inner layer 4. Case 5 is a case when the material α is used for the outer layer 1a, the material β is used for the intermediate layer 2a, and the material β is used for the inner layer 4. Case 6 is a case when the material α is used for the outer layer 1a, the material β is used for the intermediate layer 2a, and the material γ is used for the inner layer 4. Furthermore, simulations are respectively performed for Cases 3 to 6 by the conditions below, and the strength of the magnetic field $H_1$ [A/m] of the region $R_1$ illustrated in FIG. 9 is ascertained.

$\mu_r = \mu_r\alpha$ ($H_0$) of the outer layer 1a using the material α=22182
Inner diameter [m] of the inner layer 4:$D_{i4}$=0.1
Inner diameter [m] of the intermediate layer 2a:$D_{i1}$=0.2
Inner diameter [m] of the outer layer 1a:$D_{i2}$=0.3
Thickness [m] of the magnetic body material of the inner layer 4:$t_4$:=0.000278
Thickness [m] of the magnetic body material of the intermediate layer 2a:$t_1$:=0.0278
Thickness [m] of the magnetic body material of the outer layer 1a:$t_2$:=0.000278
Environmental magnetic field [μT]:$B_0$=45
Length [m] of the magnetic shield 9a:L=0.8

As a result of such a simulation, the strength of the magnetic field $H_1$ [A/m] in the region $R_1$ in a case when the cylindrical opening magnetic shield is configured by only the outer layer 1a using the material α is found to be approximately 1.83 [A/m]. That is, in the case of the magnetic shield 9a that is placed in Tokyo and the outer layer 1a is configured by the material α, the environmental magnetic field in the region $R_1$ decreases to 1.83 [A/m] due to the magnetic field attenuation by the outer layer 1a. Therefore, the magnetic field level of 1.83 [A/m] that is attenuated at the outer layer 1a is input to the intermediate layer 2a.

If a magnetic field level of 1.83 [A/m] is input as the strength of the magnetic field $H_1$, the respective relative magnetic permeability of the intermediate layer 2a of each Case is as below.

$\mu_r = \mu_r\alpha$ ($H_1$) of the intermediate layer 2a (material α) in Case 3=107430
$\mu_r = \mu_r\beta$ ($H_1$) of the intermediate layer 2a (material β) in Case 4=187007
$\mu_r = \mu_r\beta$ ($H_1$) of the intermediate layer 2a (material β) in Case 5=187007
$\mu_r = \mu_r\beta$ ($H_1$) of the intermediate layer 2a (material β) in Case 6=187007

Here, selection of the material of the inner layer 4 is performed irrespective of the strength of the magnetic field of a region that is next to the inner layer 4 in all of Cases 3, 4, or 5. That is, the material of the inner layer 4 is the material α in Cases 3 and 4, and the material β in Case 5.

On the other hand, selection of the material of the inner layer 4 is performed according to the strength of the magnetic field of a region that is next to the inner layer 4 for Case 6.

Specifically, the material of each layer is selected as below in Case 6. That is, as illustrated in FIG. 10, if the relative magnetic permeability $\mu_r\alpha$ ($H_1$) of the material α, the relative magnetic permeability $\mu_r\beta$ ($H_1$) of the material β, and the relative magnetic permeability $\mu_r\gamma$ ($H_1$) of the material γ with regard to the strength of the magnetic field $H_1$ are compared, it is seen that the relative magnetic permeability $\mu_r\beta$ ($H_1$) of the material β is higher than the relative magnetic permeability $\mu_r\alpha$ ($H_1$) of the material α or the relative magnetic permeability $\mu_r\gamma$ ($H_1$) of the material γ. The material β is therefore selected as the material of the intermediate layer 2a.

Furthermore, in a case when the material β is used as the material of the intermediate layer 2a, the strength of the magnetic field $H_2$ of the region $R_2$ is ascertained to be 0.01 [A/m]. That is, a magnetic field level of 0.01 [A/m] is input to the inner layer 4 in Case 6. The relative magnetic permeability $\mu_r\alpha$ ($H_2$) of the material α, the relative magnetic permeability $\mu_r\beta$ ($H_2$) of the material β, and the relative magnetic permeability $\mu_r\gamma$ ($H_2$) of the material γ with regard to the strength of the magnetic field $H_2$ are calculated as below.

Relative magnetic permeability $\mu_r\alpha$ ($H_2$) of the material α=796
Relative magnetic permeability $\mu_r\beta$ ($H_2$) of the material β=80
Relative magnetic permeability $\mu_r\gamma$ ($H_2$) of the material γ=7958

If these are compared, it can be seen that the relative magnetic permeability $\mu_r\gamma$ ($H_2$) of the material γ is higher than the relative magnetic permeability $\mu_r\alpha$ ($H_2$) of the material α or the relative magnetic permeability $\mu_r\beta$ ($H_2$) of the material β. The material γ is therefore selected as the material of the inner layer 4.

FIG. 11 is a diagram that respectively represents the relative magnetic permeability of each layer of Cases 3, 4, 5, and 6. By each material of the outer layer 1a, the intermediate layer 2a, and the inner layer 4 being selected as with Case 6, the shield factor of the magnetic shield 9a increased compared to each shield of Cases 3 to 5, and the shielding effect of the magnetic field by the magnetic shield 9a is improved.

FIG. 12 is a diagram that compares the shield factors of Cases 3, 4, 5, and 6.

Figure 13:
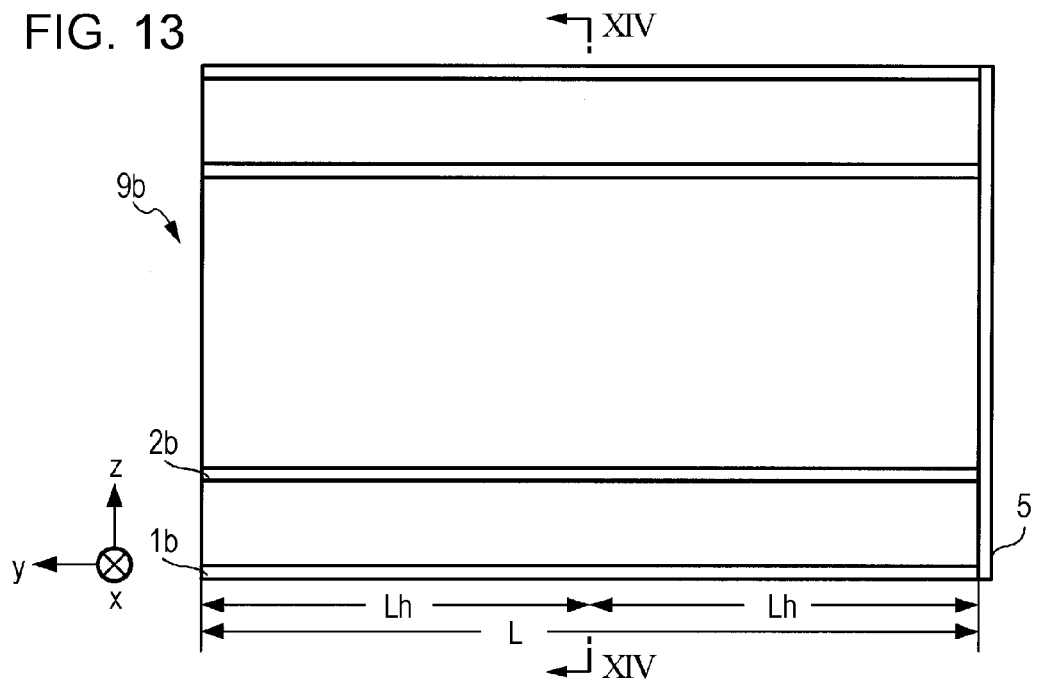
FIG. 13 is a diagram that illustrates an outline of a magnetic shield according to a third aspect of the invention.

Case 3 illustrated in FIGS. 11 and 13 is a three-layered shield in which the outer layer 1a, the intermediate layer 2a, and the inner layer 4 are manufactured by the same material α. Case 4 is a three-layered shield in which the outer layer 1a is manufactured by the material α, the intermediate layer 2a is manufactured by the material β, and the inner layer 4 is manufactured by the material α. Case 5 is a three-layered shield in which the outer layer 1a is manufactured by the material α, the intermediate layer 2a is manufactured by the material β, and the inner layer 4 is manufactured by the material β. Case 6 is the magnetic shield 9a in which the outer layer 1a is manufactured by the material α, the intermediate layer 2a is manufactured by the material β, and the inner layer 4 is manufactured by the material γ. As a result, while the magnetic flux density of the center portion in Case 3 is $-1.20 \times 10^{-8}$ [T], the magnetic flux density of the center portion in Case 4 is $-7.17 \times 10^{-9}$ [T], and the magnetic flux density of the center portion in Case 5 is $-1.51 \times 10^{-8}$ [T], the magnetic flux density of the center portion in Case 6 is $-1.26 \times 10^{-9}$ [T]. This means that while the magnitudes of the shielding of the magnetic field by the three-layered shields of Cases 3 to 5 are respectively 3752 times, 6293 times, and 2995 times, the magnitude of the shielding of the magnetic field by the magnetic shield 9a of Case 6 increases to 35731 times.

As described above, in Case 6, even if a magnetic shield that is configured by a common material (Case 3) as in the related art or different materials are used, for example, the magnetic shield 9a in which each material is selected and manufactured in Case 6 shield the magnetic field with greater efficiency compared to magnetic shields that are manufactured without attention to the relative magnetic permeability of the inner layer 4 (Cases 4 and 5).

Here, with a magnetic shield that includes three or more layers, in a case when out of the three or more layers, any one layer excluding the layer that is placed to the innermost side is the first layer and any one layer out of the layers that are placed in a hollow portion that the first layer includes on the inside is the second layer, the first material that configures the first layer and the second material that configures the second layer may be different, and out of the region between the first layer and the second layer, the relative magnetic permeability of the second material at the strength of the magnetic field in a region that is next to the second layer may be higher than the relative magnetic permeability of the first material at the strength of the magnetic field. Further, in such a case, it is preferable that the second layer be the layer that is placed to the outermost side out of the layers that are placed in the hollow portion of the first layer. Furthermore, in such a case, it is preferable that in all combinations of the first layer and the second layer, out of the region between the first layer and the second layer, the relative magnetic permeability of the material of the second layer (second material) at the strength of the magnetic field in the region that is next to the second layer be higher than the relative magnetic permeability of the material of the first layer (first material) at the strength of the magnetic field.

3. Third Embodiment

While each layer that configures the magnetic shields 9 and 9a according to the first and second embodiments are cylindrical members, such layers are not limited to cylindrical members, and may be polygonal tubes with polygonal cross-sections (a triangle, a square, a pentagon . . . , or the like) or tubes with elliptical cross-sections. Further, the shape of the magnetic shield is not limited to tubes, and as long as the hollow portion described above is included, may be a box of a multi-angular prism such as a quadrangular prism, or may be a so-called "bottomed tube shape" in which only one of the two opening portions of a tube is closed by a wall. Further, the magnetic shield may include a tubular member with a shape in which an opening portion that connects to space on the inside is included and a lid-like member of a size that covers the opening portion. In such a case, the magnetic shield may be configured to close the opening portion of the tubular member with the lid-like member.

Figure 14:
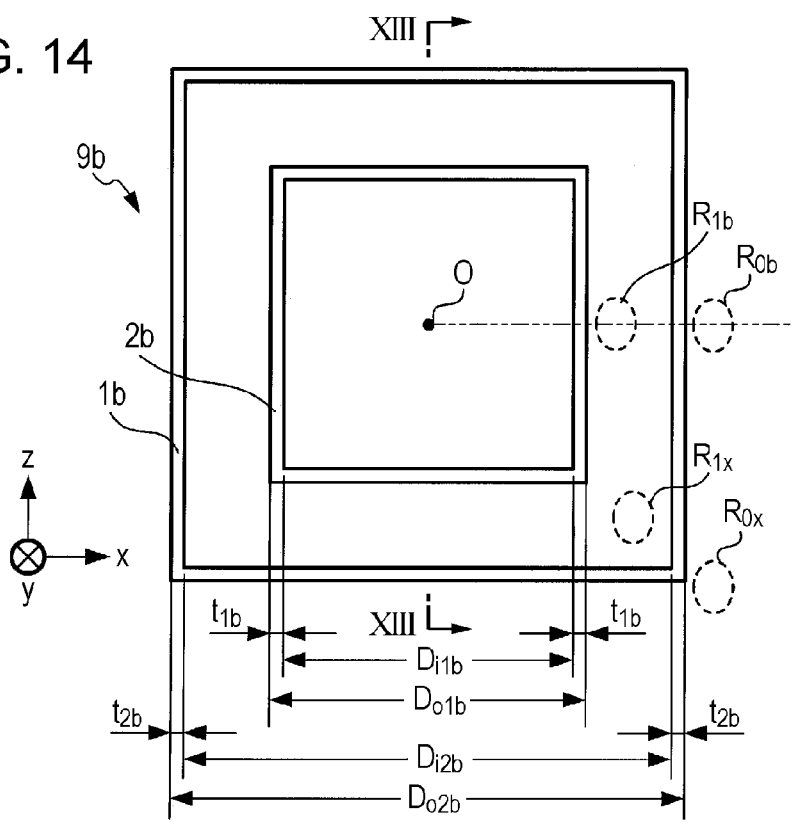
FIG. 14 is another diagram that illustrates the outline of the magnetic shield according to the third aspect of the invention.

FIG. 13 is a diagram that illustrates an outline of a magnetic shield 9b according to a third embodiment of the invention, and is a cross-sectional diagram of when the magnetic shield 9b is viewed from an arrow XIII-XIII of FIG. 14. FIG. 14 is a diagram that illustrates an outline of the magnetic shield 9b according to the third embodiment of the invention, and is a cross-sectional diagram of when the magnetic shield 9b is viewed from an arrow XIV-XIV of FIG. 13.

The magnetic shield 9b includes a polygonal tube with a square cross-section (hereinafter referred to as a polygonal tube member) and a plate-like member that is provided on one side of the opening portions of the polygonal tube member. The shape of the magnetic shield 9b is a bottomed tube in which two polygonal tube-like members and one plate-like member are combined. The magnetic shield 9b is a shield that includes an outer layer 1b that is a polygonal tube member that includes a hollow portion on the inside, an inner layer 2b that is a hollow polygonal tube member that is placed in the hollow portion of the outer layer 1b, and a bottom layer 5 that is a plate-like member that shuts each opening portion at the −y direction end of the outer layer 1b and the inner layer 2b.

The outer layer 1b includes an axis O that is parallel to the y axis direction. The inner layer 2b is placed so that the axis thereof overlaps the axis O of the outer layer 1b. That is, the outer layer 1b and the inner layer 2b have a common axis. Here, the axis of a polygonal tube member passes through the rotationally symmetrical center of a square that corresponds to the inner circumference or the outer circumference out of the cross-section thereof, and extends along the direction in which the polygonal tube member extends.

As illustrated in FIG. 14, the length of a side of the square that corresponds to the outer circumference of the outer layer 1b is $D_{o2b}$ [m]. The length of a side of the square that corresponds to the inner circumference of the outer layer 1b is $D_{i2b}$ [m]. The length of a side of the square that corresponds to the outer circumference of the inner layer 2b is $D_{o1b}$ [m]. The length of a side of the square that corresponds to the inner circumference of the inner layer 2b is $D_{i1b}$ [m]. The thickness of the magnetic body material of the outer layer 1b is $t_{2b}$ [m]. The thickness of the magnetic body material of the inner layer 2b is $t_{1b}$ [m].

As illustrated in FIG. 13, the arrow XIV-XIV indicates a cross-section that passes through the center of the outer layer 1b and the inner layer 2b in the axial direction. That is, the outer layer 1b and the inner layer 2b respectively extend from the cross-section that is indicated by the arrow XIV-XIV over a length Lh that is half of the length L in the +y direction and the −y direction.

As illustrated in FIG. 14, the arrow XIII-XIII passes through the axis O. The material of the outer layer 1b of the magnetic shield 9b is determined based on the strength of the magnetic field $H_0$ [A/m] in a region $R_{0b}$ that is illustrated in FIG. 14. The material of the inner layer 2b of the magnetic shield 9b is determined based on the strength of the magnetic field $H_1$ [A/m] in a region $R_{1b}$ that is illustrated in FIG. 14.

Here, while the strengths of the magnetic field which are respectively input to the outer layer and the inner layer are on the outside of the outer layer and the inner layer and are ascertained in regions next to the outer layer and the inner layer in the case of the first and second embodiments, according to the third embodiment, the outer layer and the inner layer are polygonal. The strength of the magnetic field may therefore be different depending on whether the magnetic field is next to a side of the polygon or next to the apex of the polygon. In such a case, it is desirable that the strength of the magnetic field of a region that is next to the center of a side be the reference for material selection.

Here, out of the sides of a polygon of the cross-section, a region that is next to the center thereof is the outside of the polygon, and can be said to be the close region to the rotational symmetrical center of the polygon. The implication above is that in regions between the outer layer (first layer) and the inner layer (second layer) and region that are next to the inner layer, the strength of the magnetic field in the region that is closest to the axis of the inner layer is the reference for material selection. In other words, at the strength of the magnetic field in the region described above, the relative magnetic permeability of the material that is used for the inner layer may be higher than the relative magnetic permeability of the material that is used for the outer layer.

The material of the outer layer 1b is therefore selected based not on a region $R_{0x}$ that is a region that is next to the apex but on the strength of the magnetic field $H_0$ [A/m] of the magnetic field in the region $R_{0b}$ that is next to the center of a side. Specifically, a material with a high relative magnetic permeability of each candidate material is selected as such a material at the strength of the magnetic field $H_0$ [A/m].

Further, the material of the inner layer $2b$ is also selected based not on a region $R_{1x}$ that is a region that is next to the apex but on the strength of the magnetic field $H_1$ [A/m] of the magnetic field in the region $R_{1b}$ that is next to the center of a side. Specifically, a material with a high relative magnetic permeability of each candidate material is selected as such a material at the strength of the magnetic field $H_1$ [A/m].

4. Modifications

While the embodiments have been described above, the contents of the embodiments may be modified as below. Further, the modifications below may be combined.

(1) While in the embodiments described above, with the material of a layer, the strength of the magnetic field of a region that is next to the layer on the outside of the layer is specified and the material with which the relative magnetic permeability at the strength of the magnetic field is the highest is selected, the axis direction of the layer in the region that is next to the layer is not particularly limited. For example, the material of a layer may be determined based on the strength of the magnetic field of a region of the center portion in the axis direction of the layer out of the regions that are next to the layer on the outside of the layer. The center portion is a region that passes through the middle point of the axis and that includes a plane that is vertical to the axis, and is a region across the range of a predetermined proportion (for example, 20%) out of a range of the entire layer in the axial direction.

(2) Further, the position of a region in the axial direction may also be limited by the strength of the magnetic field in the region. That is, the material of a layer may also be determined based on the strength of the magnetic field of the region of a portion in which the strength of the magnetic field is the strongest out of the regions that are next to the layer on the outside of the layer.

(3) A magnetic shield respectively stores a magnetism measurement device and the measurement target that is measured by the magnetism measurement device on the inside, for example, and is used for the purpose of shielding the environmental magnetic field that is input therein. In such a case, the position in which the measurement target is placed may be determined according to the position of the region that is the reference for the selection of the material. For example, in a case when the strength of the magnetic field of the center portion of a layer in the axial direction out of the region that are next to the layer is the reference of the material selection, the measurement target may be placed at the center point of the axis of the layer. Further, in a case when the point at which the strength of the magnetic field is the strongest out of the regions that are on the outside of the layer and that are next to the layer is the reference for the material selection, the measurement target may be placed on an intersection of a tangent that extends from such a point to the axis of the layer and the axis.

The entire disclosure of Japanese Patent Application Nos. 2011-082917, filed Apr. 4, 2011 and 2012-037138, filed Feb. 23, 2012, are expressly incorporated by reference herein.

What is claimed is:

1. A magnetic shield comprising:
three or more hollow members including a center, a first and a second hollow member, wherein
the center hollow member is located innermost among the three or more hollow members,
the first hollow member is configured by a first material,
the second hollow member is configured by a second material that is different from the first material, the second hollow member is disposed inside of the first hollow member without contacting the first hollow member,
the center hollow member is disposed inside of the second hollow member without contacting the second hollow member,
when a magnetic field strength of a region between the first and second hollow members is a reference magnetic field strength, a relative permeability of the second hollow member with respect to the reference magnetic field strength is higher than a relative permeability of the first hollow member with respect to the reference magnetic field strength,
the first hollow member is outermost among the three or more hollow members, and
when a magnetic field strength of a region between the second and the center hollow members is another reference magnetic field strength, a relative permeability of the center hollow member with respect to the another reference magnetic field strength is higher than a relative permeability of the second hollow member with respect to the reference magnetic field strength.

* * * * *